(12) United States Patent
Ishizaka

(10) Patent No.: US 7,193,365 B2
(45) Date of Patent: Mar. 20, 2007

(54) HIGH-INTENSITY LIGHT EMITTING DIODE WITH CONCAVE AND CONVEX SHAPED LIGHT SCATTERING PORTIONS FORMED ON A COVER

(75) Inventor: Mitsunori Ishizaka, Yamanashi (JP)

(73) Assignee: Citizens Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/360,922

(22) Filed: Feb. 10, 2003

(65) Prior Publication Data

US 2003/0151361 A1   Aug. 14, 2003

(30) Foreign Application Priority Data

Feb. 8, 2002   (JP) .......................... P2002-031762

(51) Int. Cl.
*H01L 33/00* (2006.01)
*H01J 1/62* (2006.01)

(52) U.S. Cl. ............ 313/512; 313/501; 313/498; 313/116; 313/110; 257/98; 257/99; 257/100

(58) Field of Classification Search .............. 313/512, 313/515, 501–503; 257/98–103; 362/268, 362/231, 256, 240
See application file for complete search history.

(56) References Cited

U.S. PATENT DOCUMENTS

| | | | | |
|---|---|---|---|---|
| 4,143,394 A | * | 3/1979 | Schoberl ..................... | 257/98 |
| 4,780,752 A | * | 10/1988 | Angerstein et al. ......... | 257/788 |
| 4,843,280 A | * | 6/1989 | Lumbard et al. ............ | 313/500 |
| 5,633,623 A | * | 5/1997 | Campman .................... | 340/321 |
| 5,931,570 A | * | 8/1999 | Yamuro ....................... | 362/355 |
| 6,352,359 B1 | * | 3/2002 | Shie et al. .................... | 362/522 |
| 6,467,922 B1 | * | 10/2002 | Blanc et al. ................. | 362/612 |
| 6,502,952 B1 | * | 1/2003 | Hartley ....................... | 362/184 |
| 6,614,172 B2 | * | 9/2003 | Chiu et al. ................... | 313/501 |
| 6,657,382 B2 | * | 12/2003 | Nagai et al. ................. | 313/512 |
| 6,674,096 B2 | * | 1/2004 | Sommers ...................... | 257/98 |
| 6,846,098 B2 | * | 1/2005 | Bourdelais et al. .......... | 362/330 |
| 2002/0123163 A1 | * | 9/2002 | Fujii ............................ | 438/26 |

FOREIGN PATENT DOCUMENTS

| | | | | |
|---|---|---|---|---|
| GB | 1584708 | A | * | 2/1981 |
| JP | 61032483 | A | * | 2/1986 |
| JP | 2000058927 | A | * | 2/2000 |

OTHER PUBLICATIONS

M. Yoshio et al; Patent Abstracts of Japan; Publication No. JP 2000-124507; "Surface-Mounted Light-Emitting Diode"; 2000.

* cited by examiner

*Primary Examiner*—Sikha Roy
(74) *Attorney, Agent, or Firm*—Browdy and Neimark, PLLC

(57) ABSTRACT

A light emitting diode, capable of accomplishing enlargement of emitted range of light and equalization of brightness of emitted light has a substrate (22), electrodes (23a, 23b), a light emitting element (24) mounted on the substrate (22) and connected electrically with the electrodes (23a, 23b), a resinous cover (26) for sealing the light emitting element (24) and electrodes (23a, 23b) and an uneven shaped light scattering part (30) provided on the surface of the cover.

1 Claim, 5 Drawing Sheets

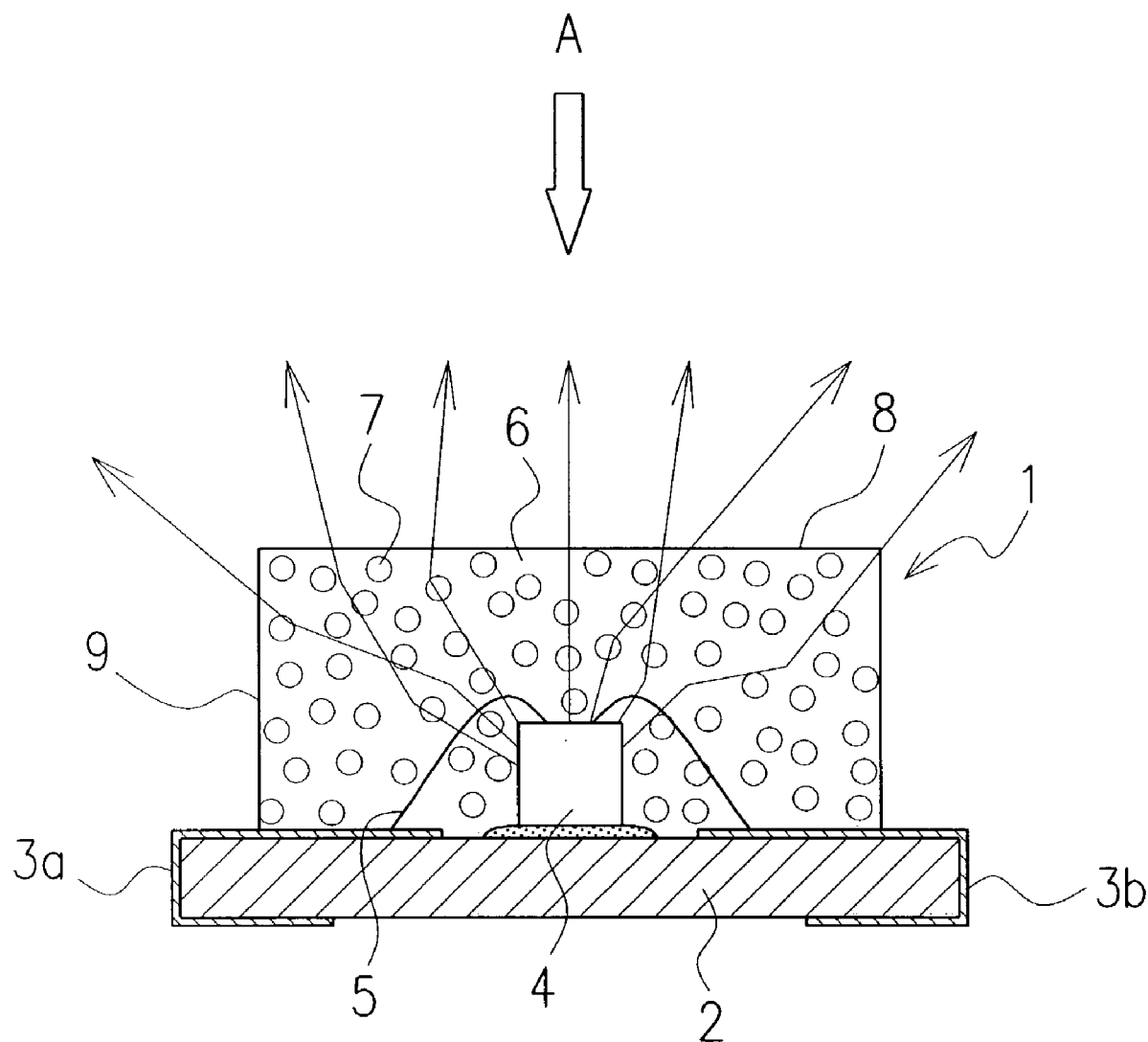

HIGH-INTENSITY LIGHT EMITTING DIODE WITH CONCAVE AND CONVEX SHAPED LIGHT SCATTERING PORTIONS FORMED ON A COVER

BACKGROUND OF THE INVENTION

1. Field of the Invention

The present invention relates to a light emitting diode, more specifically, to a light emitting diode capable of scattering widely and efficiently emitted light.

2. Description of the Prior Art

Generally, a light emitting diode for emitting light by a current is well known.

A conventional typical light emitting diode 1 is shown in FIG. 5. The light emitting diode 1 comprises a substrate 2, a pair of electrodes 3a and 3b mounted on the substrate 2, a light emitting element 4 fixed on the substrate 2, bonding wires 5 for connecting the light emitting element 4 with the electrodes 3a and 3b and a resinous cover 6 mounted on the substrate to seal the light emitting element 4 and bonding wires 5.

The cover 6 acts to prevent the light emitting element 4 and bonding wires 5 from corroding and so on, and is formed from a transparent epoxy resin material to pass through light emitted from the light emitting element 4.

In the aforementioned conventional light emitting diode 1, a large number of light scattering micro particles 7 of SiO2, TiO2 and so on are mixed in the cover 6 in order to scatter widely light from the light emitting element 4 and to enhance brightness of the light by diffused reflection of the light within the cover 6 (see Japanese Laid-Open Publication 2000-124507). In this way, the light radiated from the light emitting element 4 strikes against the light scattering particles 7 to go to any directions within the cover 6 while repeating the reflection or refraction, thus scattering from outer surfaces of the cover 6.

However, since the light scattering particles mixed into the cover 6 are minute in the construction as described above, when the light strikes against the particles, the refraction of the light by the particles is less.

Consequently, it is not possible to obtain a large scattering effect of light. In fact, when viewing a light emitting projected surface 8 of the light emitting element 4 from the right above thereof (direction of arrow A) in FIG. 5, the light emitting projected surface 8 can be looked to shine brightly, while, the brightness of the light emitting projected surface is less than that in the case of viewing the projected surface from the right above, when viewing obliquely slightly the light emitting projected surface 8.

As a result, there is a problem that the light emission is not uniform in accordance with an angle of viewing the light emitting projected surface.

Further, if amount of the light scattering particles mixed into the cover is more, it is possible to obtain a high light scattering effect, while the light transmission is less to thus become low brightness. Inversely, if the amount of mixing the particles 7 is less, it is not possible to obtain sufficient light scattering effect. Consequently, there is a problem that more producing processes and a high cost for production are required since the mixed amount of the particles must be precisely adjusted based on a kind and a size of the light emitting diode.

SUMMARY OF THE INVENTION

It is therefore a first object of the present invention to provide a light emitting diode capable of accomplishing enlargement of scattered range of light and equalization of brightness of emitted light by increasing scattering effect of light emitted from a cover for sealing a light emitting element.

It is a second object of the present invention to provide a light emitting diode capable of obtaining a high scattering effect and eliminating costs of material and production.

To accomplish the above objects, a light emitting diode according to the present invention comprises a substrate, a pair of electrodes provided on the substrate, a light emitting element mounted on the substrate and connected electrically with the electrodes, a cover mounted on the substrate for sealing the electrodes and light emitting element, and a light scattering part provided on at least one surface of the cover.

It should be noted that the light scattering part is formed from an uneven configuration.

In one embodiment, the cover is formed from a resin and the light scattering part is formed from a plurality of concave and convex portions provided on a surface of the cover. The concave and convex portions are minute in size.

For example, the light scattering part is composed of a film attached on a surface of the cover and concave and convex portions formed on the film.

The light scattering part is also composed of a plurality of concave and convex portions formed on a surface of the cover by mean of printing.

In the other embodiment, the cover is made of a formable material by a molding and the light scattering part is composed of concave and convex portions formed on a surface of the cover when the cover is formed.

The concave and convex portions of the light scattering part may be formed by means of machining a surface of the cover.

As an example, the light scattering part is formed on a surface of the cover opposite to a light emitting projected surface of the light emitting element.

The concave and convex portions of the light scattering part are arranged alternately continuously to each other.

It is preferable that depth and oblique angle of each of their concave and convex portions may be mutually un-uniform.

In one example, the uneven light scattering part is formed by etching carried out on a surface of the cover.

The light scattering part is also formed from a frosted glass attached on a surface of the cover.

For example, depth of the concave and convex portions of the light scattering part is 4 μm.

BRIEF DESCRIPTION OF THE DRAWINGS

FIG. 5 is a sectional view showing a conventional light emitting diode in which light scattering particles are mixed into a cover.

DETAILED DESCRIPTION OF THE PREFERRED EMBODIMENTS

Figure 1:
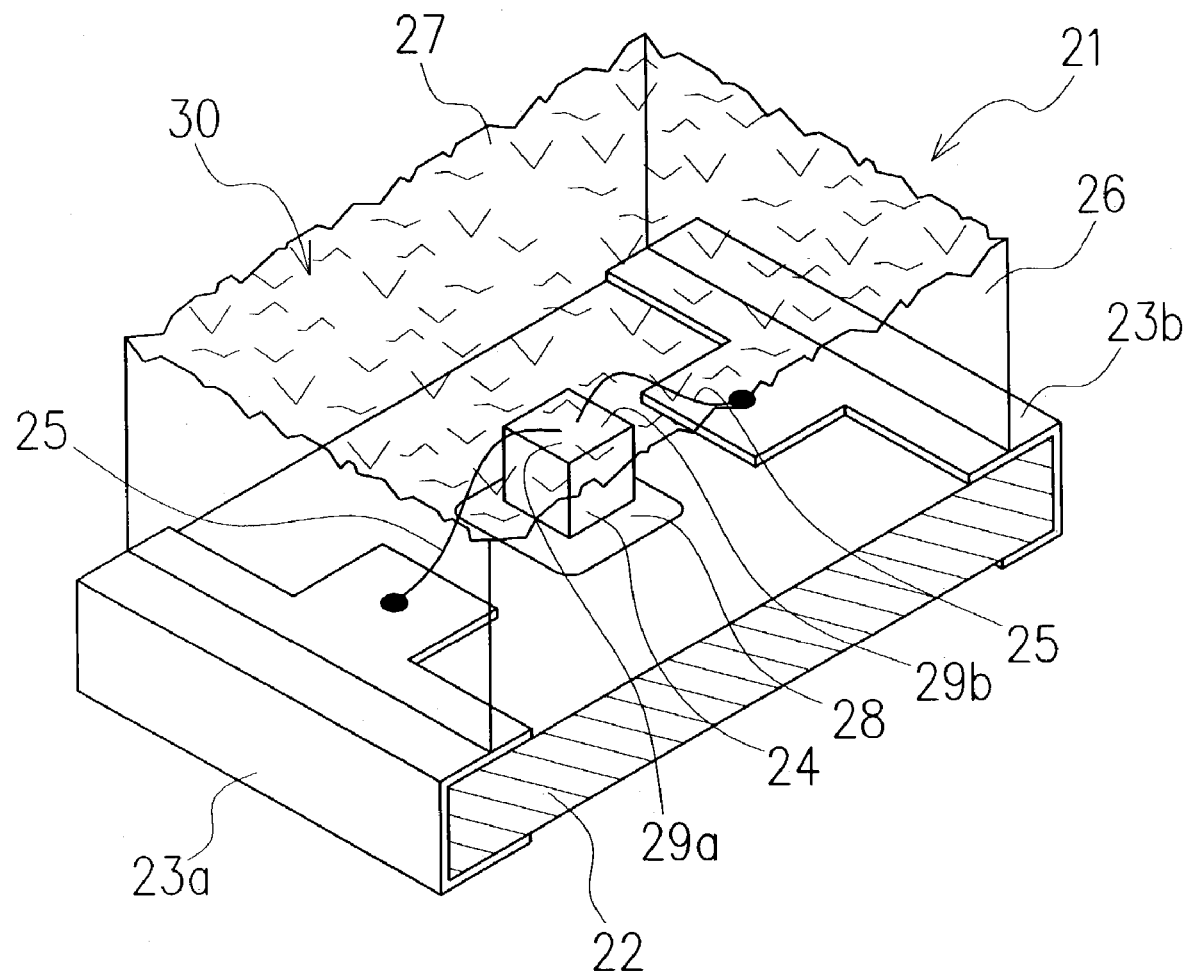
FIG. 1 is a perspective view showing an entire configuration of a light emitting diode according to the present invention.

Referring to FIG. 1, one embodiment of a light emitting diode according to the present invention is shown.

The light emitting diode 21 in the embodiment comprises a substrate 22 made of glass epoxy, BT resin (bismaleimide triazine resin) or the like, a pair of electrodes 23a and 23b mounted on the substrate 22, a light emitting element 24 mounted on the substrate 22, bonding wires 25 for connecting electrically the light emitting element 24 and electrodes 23a and 23b, and a cover 26 for sealing the light emitting element 24, electrodes 23a and 23b and at least connecting portions between the electrodes and bonding wires.

In this way, covering the light emitting element 24, electrodes 23a and 23b, bonding wires 25 and so on by the cover 26 causes the portions covered by the cover to be protected from corrosion.

Note that the electrodes 23a and 23b may be mounted on an outside substrate of a mother board (not shown) and so on.

The light emitting element 24 may be formed from, for example, a square micro silicon chip. The light emitting element is fixed at its bottom on the substrate 22 by means of an insulating adhesive 28. For example, an upper surface of the light emitting element 24 is provided with a pair of electrodes 29a and 29b (anode and cathode electrodes).

One of the bonding wires 25 is connected at one end to the electrode 29a of the element 24 and at the other end to the electrode 23a mounted on the substrate 22. The other bonding wire is connected at one end to the electrode 29b of the element 24 and at the other end to the electrode 23b mounted on the substrate 22.

The cover 26 is formed from a three dimensional sealing body attached on the substrate 22 centering on the light emitting element 24.

In one embodiment, the cover 26 is consisted by forming a material of epoxy resin having permeability by means of a molding.

Figure 4:
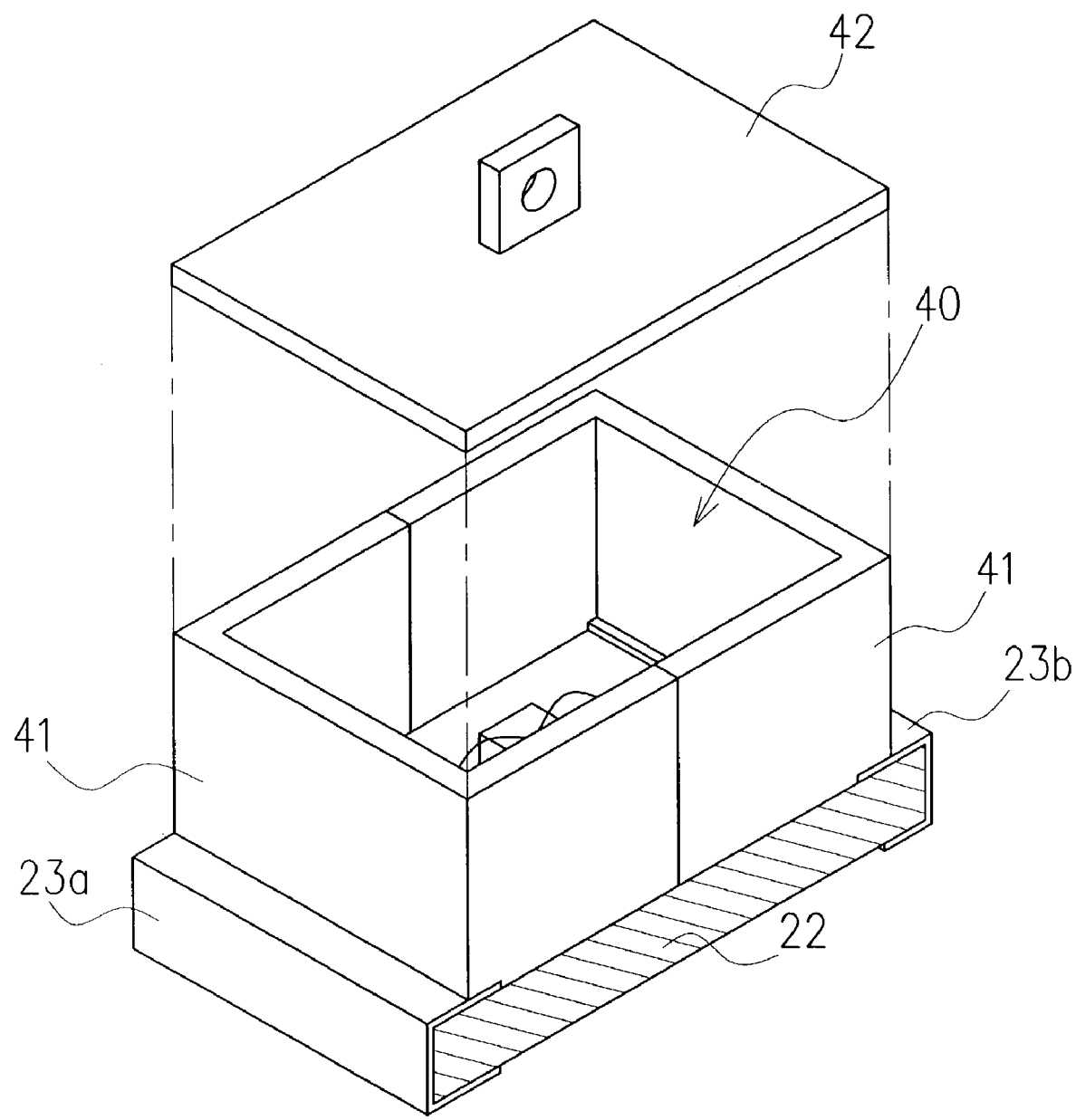
FIG. 4 is a perspective view showing a structure of a molding for producing a cover in a light emitting diode according to the present invention.

In this case, the molding, for example, has a pair of U-shaped side mold pieces 41,41 for forming a space 40 corresponding to a prepared shape of the cover 26 and an upper mold piece 42 disposed at an upper surface of the mold pieces 41,41 as shown in FIG. 4.

The pair of side mold pieces 41, 41 are first disposed on the substrate 22 after the light emitting element 24, electrodes 23a, 23b and bonding wires 25 are mounted on the substrate as described above and as shown in FIG. 1 and then a predetermined amount of liquid epoxy resin is poured into the space 40 surrounded by the pair of side mold pieces and then the upper mold piece 42 is mounted on the side mold pieces.

After a predetermined time is elapsed, in other words, when the epoxy resin is hardened, the side and upper mold pieces are removed in order to form the cover 26 as shown in FIG. 1. Because the cover has permeability of light, light emitted from the light emitting element 24 passes through the cover and then is emitted from surfaces of the cover to outside of the cover as scattered light.

As the other method for producing the cover using a molding, for example, there is a case of forming together a great number of light emitting diodes on one substrate. In this case, the substrate is first surrounded with the molding and then the great number of light emitting diodes are arranged on the substrate and then each light emitting diode and electrodes provided on the substrate are connected by the bonding wires. Liquid epoxy resin is poured from the above of the substrate in a space surrounded by the molding. After the epoxy resin is hardened, the molding is removed from a product formed by the resin. Finally, the product is separated in individual light emitting diode by dicing every the light emitting diode in x and y directions of the product.

It should be noted in the present invention that light scattering means is provided on the cover 26. The light scattering means is composed of an uneven light scattering part 30 formed on at least one surface of the cover, for example, on an upper surface, namely, on a light emitting projected surface 27 of the cover 26 facing to the upper surface of the light emitting element 24, in the shown embodiment.

Concretely, the light scattering part is composed of a configuration that a large number of concave and convex portions 31 and 32 are alternately arranged in one embodiment. These concave and convex portions are provided on, for example, the entire region of the light emitting projected surface 27. Size and arrangement of the concave and convex portions, oblique angle of circumferential walls forming the concave and convex portions and so on may be set adequately according to a degree of scattering of light emitted from the cover 26 toward the outside thereof.

As described above, light emitted toward the above from the light emitting element 24 is scattered widely toward the outside of the cover at the emitted surface of the cover having the large number of concave and convex portions by function of the concave and convex portions, more specifically, based on the oblique angle of the circumferential walls.

When the cover 26 is formed by a molding, the a shape of the concave and convex portions in the light scattering part 30 is formed by carrying out etching on the upper surface of the cover 26 which is in semi-hardened state or by pressing a processing jig which has concave and convex patterns to form the concave and convex portions on the upper surface of the cover 26. Further, after the cover 26 is hardened completely, the concave and convex portions having a predetermined depth or oblique angle may be formed by machining the upper surface of the cover, for example, cutting.

The depth and oblique angle of each of their concave and convex portions consisting the light scattering part 30 are determined in accordance with an object of using and a specification of emitting light for the light emitting diode 21 while it is preferable to increase the depth of the concave and convex portions in order to increase the scattering of light.

In this embodiment, it is possible to obtain a large light scattering effect by setting in such a manner that the depth of the concave and convex portions is more than 4 μm and the oblique angle is in a range of 1~45 degrees in case of the thickness of 400 μm of the cover 26.

It is recognized that the depth and oblique angle of each of the concave and convex portions in the light scattering part 30 are un-uniform and with a degree of unevenness, a large light scattering effect is obtained since the reflection and refraction of light become irregular.

Next, an operation of emitting light of the light emitting diode 21 as constructed in the above will be explained in connection with FIG. 2.

As well known, the light emitting diode 21 emits light by the electrodes 23a and 23b mounted on the substrate 22 being powered on and by the light emitting element 24 being excited.

The emitted light goes through the cover to the light emitting projected surface 27 of the cover 26 facing to the light emitting element 24 and further is refracted at the uneven light scattering part 30 formed on the light emitting projected surface 27 and the refracted light is scattered with many angles to the outside of the cover.

Such refraction of light varies according to the depth or oblique of the concave and convex portions to emit not only from the upper surface of the cover 26 and to emit but also from a side surface of the cover 26 with large refraction. There is also a case that after the light emitted from the light emitting element 24 is reflected on the light scattering part 30 and then is reflected within the cover 26 to finally emit from the cover to the outside thereof.

Because the refraction and reflection of light are generated continuously within the cover and at the outer surface (s) of the cover, there is no difference between brightness in case of looking at the light emitting projected surface 27 from the right above and brightness in case of looking at the light emitting projected surface 27 from a deviated position which is sideward obliquely of the surface.

Accordingly, it is possible to obtain a wide range of light scattering and high brightness as a whole of the cover.

Figure 3:
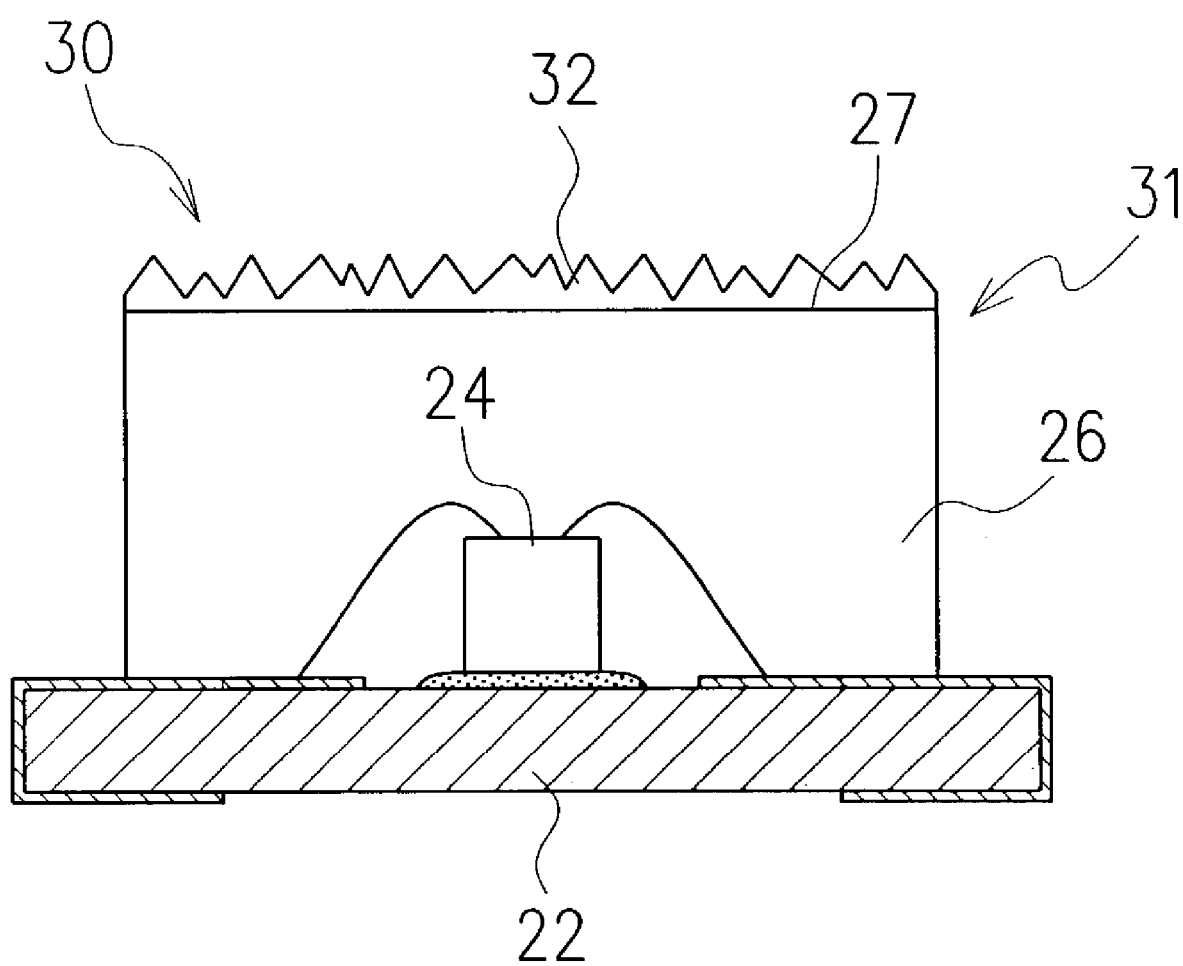
FIG. 3 is a sectional view of a light emitting diode in which a light scattering part is formed by printing.

FIG. 3 illustrates an example of a structure in which the light scattering part 30 is formed by printing.

The light emitting diode 31 according to this embodiment has a film 32 printed on the light emitting projected surface 27 of the cover 26 for sealing the light emitting element 24. The film is made of, for example, a resin and has at one surface concave and convex portions for scattering light. Alternatively, after a thin sheet is printed on the light emitting projected surface 27, the concave and convex portions may be formed on the sheet to make the aforementioned film.

Figure 2:
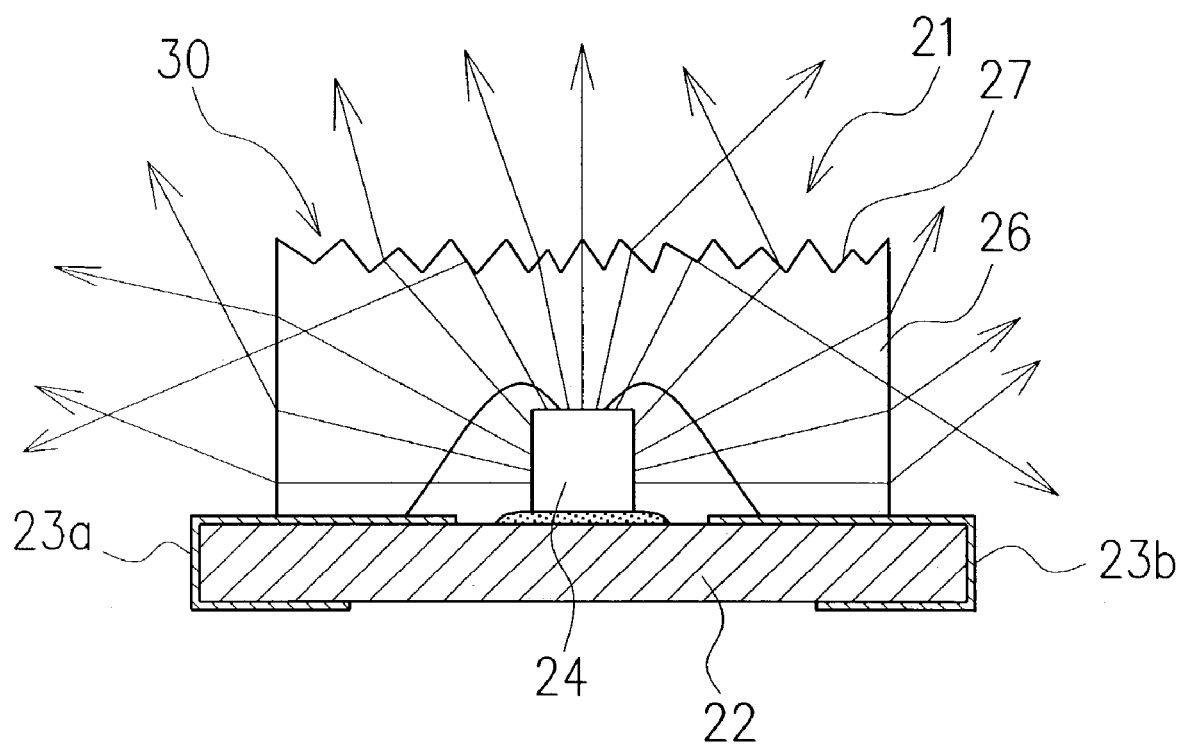
FIG. 2 is a sectional view of the light emitting diode shown in FIG. 1.

Shape, depth and so on of the concave and convex portions in the embodiment may be similarly set as that of the light emitting diode 21 as shown in FIGS. 1 and 2.

It is also preferable that the same transparent epoxy resin material as that of the cover 26 is used in the film not to lose permeability of light.

Other than the methods shown in FIGS. 1 and 2, the uneven light scattering part 30 can be formed simultaneously with forming of the cover 26 by pre-forming concave and convex surfaces in an inner wall of a molding used in forming the cover 26. For example, if the concave and convex portions are formed on the back surface of the upper mold piece 42 as shown in FIG. 4, it is possible to form the concave and convex portions on a surface of the cover to make the light scattering part when the cover is formed.

According to this formation, it is possible to use adequately and selectively a molding according to a specification of a light emitting diode to be produced by use of prepared several kinds of moldings having different shapes of the concave and convex portions.

In such a case, the uneven light scattering part can be formed by a conventional resin forming proves and therefore a light emitting diode in which light is widely emitted can be produced inexpensively without increasing number of process.

Further, the light scattering part may be composed of a frosted glass (not shown) attached on one surface of the cover 26.

Although the light scattering part 30 is disposed on the light emitting projected surface 27 laying at the upper surface of the cover 26 in the aforementioned embodiment, the similar light scattering part may be provided on one or more side surfaces of the cover 26 and further if the light emitting projected surface is provided on a side surface of the cover 26, the light scattering part may be formed only on the light emitting projected surface.

In the embodiments as described above, although the electrodes 23a and 23b mounted on the substrate 22 and the light emitting element 24 are connected by the bonding wires 25, alternatively, it is possible to connect the electrodes and light emitting element by a flip-chip mounting method in which a soldered bump which is formed on the lower surface of the light emitting element 24 is connected directly with the electrodes 23a and 23b.

As described above, according to the light emitting diode in the present invention, since the uneven light scattering part is provided on the surface of the cover for sealing the light emitting element, light emitted from the light emitting element can be largely refracted at the light scattering part to cause the light to scatter widely. Other than emitting the light from the light emitting element to the outside of the cover, a scattering phenomenon is occurred within the cover by light reflected on the inside of the cover to equalize the emitted light and to enhance entire brightness of the emitted light. It is therefore possible to emit uniformly in all direction without dispersion of the emitted light in accordance with an angle of looking at the light emitting diode.

The light scattering part can also be formed easily by means of a process of rough surface by etching or cutting out of the surface of the cover. As a result, it is possible to produce inexpensively by a small number of processes.

What is claimed is:

1. A high-intensity light emitting diode comprising:
   a substrate;
   a pair of electrodes provided on said substrate;
   a light emitting element mounted on said substrate and connected electrically with said electrodes, the light emitting element having a light-projecting surface;
   a transparent cover comprising a cuboid resin formed on said substrate for sealing said electrodes and said light emitting element; and
   a concave and convex shaped light scattering part provided on a flat surface of said cover facing toward the light-projecting surface of the light emitting element;
   wherein said light scattering part includes a plurality of concave and convex portions formed on the flat surface of the cover,
   wherein a depth and an oblique angle of each of the concave and convex portions are un-uniformly formed with respect to each other so that light scatters in a wide-angle direction at the light scattering part,
   wherein the depth of each of the concave and convex portions of the light scattering part is 4 μm or more, and
   wherein the oblique angle made by each of the concave and convex portions of the light scattering part is in a range of 1 to 45 degrees.

* * * * *